United States Patent
Miyamoto

(10) Patent No.: US 9,264,818 B2
(45) Date of Patent: Feb. 16, 2016

(54) DIGITAL SIGNAL PROCESSOR WITH SEARCH FUNCTION

(71) Applicant: TEAC Corporation, Tokyo (JP)

(72) Inventor: Takashi Miyamoto, Tokyo (JP)

(73) Assignee: TEAC Corporation, Tama-shi, Tokyo (JP)

( * ) Notice: Subject to any disclaimer, the term of this patent is extended or adjusted under 35 U.S.C. 154(b) by 219 days.

(21) Appl. No.: 14/172,669

(22) Filed: Feb. 4, 2014

(65) Prior Publication Data
US 2014/0355788 A1 Dec. 4, 2014

(30) Foreign Application Priority Data
May 29, 2013 (JP) .................. 2013-112801

(51) Int. Cl.
*G06F 17/00* (2006.01)
*H04R 23/00* (2006.01)
*G10H 1/46* (2006.01)
*G11B 20/00* (2006.01)
*H03M 3/00* (2006.01)

(52) U.S. Cl.
CPC ............. *H04R 23/00* (2013.01); *G10H 1/46* (2013.01); *G10H 2250/035* (2013.01); *G11B 2020/00065* (2013.01); *H03M 3/30* (2013.01)

(58) Field of Classification Search
CPC ............. G10H 2250/035; G11B 2020/00065; H04B 14/062; H03M 3/30
USPC ............................. 700/94; 375/247; 715/830
See application file for complete search history.

(56) References Cited

U.S. PATENT DOCUMENTS

| | | | | |
|---|---|---|---|---|
| 7,173,550 B1 * | 2/2007 | Melanson | ........ | G11B 20/10527 341/118 |
| 7,205,919 B2 * | 4/2007 | Noguchi | ............. | H04B 14/062 341/141 |
| 2006/0058901 A1 * | 3/2006 | Aida | ................ | G11B 20/10527 700/94 |

FOREIGN PATENT DOCUMENTS

JP 3334413 B2 10/2002

OTHER PUBLICATIONS

English Machine Translation of JPH08274644, Mar. 11, 2015.*

* cited by examiner

*Primary Examiner* — Joseph Saunders, Jr.
(74) *Attorney, Agent, or Firm* — Seed IP Law Group PLLC

(57) ABSTRACT

A device that enables easy, reliably performance of a search at a desired position even in the case of a one-bit digital signal. A control section of a digital signal processing device extracts a one-bit digital signal of a predetermined period from a memory section at a position designated by a jog dial and iteratively outputs the signal to a multi-bit converter. The multi-bit converter converts the one-bit digital signal into a multi-bit signal, and a multiplier subjects the multi-bit signal to fade-in and fade-out processing. A ΔΣ modulator re-converts the thus-processed signal into the one-bit digital signal, outputting the digital signal.

8 Claims, 3 Drawing Sheets

DIGITAL SIGNAL PROCESSOR WITH SEARCH FUNCTION

PRIORITY INFORMATION

This application claims priority to Japanese Patent Application No. 2013-112801, filed on May 29, 2013, which is incorporated herein by reference in its entirety.

BACKGROUND OF THE INVENTION

1. Technical Field

The present invention relates to a digital signal processor and, more particular, to a digital signal processor with a search function.

2. Related Art

A digital signal processor, like a multi-bit PCM recorder, often employs a jog (JOG) dial to search for a position in music accurately. A desired position can be searched by actuation of the jog dial to shift a position in music while an arbitrary position in music is being iteratively reproduced for; for instance, about 100 msec.

In the case of a one-bit digital signal; however, a method available at present to search for a position in music is only a method of searching for a desired position while reproducing music data in a normal mode. Difficulty is encountered in accurately searching for a desired position.

JP 3334413 B discloses a technique of: converting a one-bit signal into a 16-bit multi-bit digital signal; subjecting the digital signal to fading; and again subjecting the thus-faded signal to $\Delta\Sigma$ modulation, in order to subject the one-bit digital signal to signal processing in an amplitude direction.

However, the related-art technique discloses only subjecting a one-bit digital signal to signal processing in an amplitude direction. There is no disclosure about a search for a one-bit digital signal. Searching for a position in music while reproducing a one-bit digital signal in a normal mode still remains as the only method.

Even when an attempt is made to perform a search by designating an arbitrary position in a one-bit digital signal with a jog dial and iteratively reproducing the signal for 100 msec, spike noise will occur in a splice between iterations. The spike noise will be harsh on the ear and pose difficulty in performing a search reliably.

The invention provides a device that enables performance of an easy, reliable search for a desired position even in a one-bit digital signal.

SUMMARY

The invention provides a digital signal processor with a search function comprising memory means that stores a one-bit digital signal; a jog dial that can be rotatively actuated by a user; control means that extracts from the memory means the one-bit digital signal of a predetermined period with reference to a position designated by rotative actuation of the jog dial; conversion means for converting the extracted one-bit digital signal into a multi-bit signal; multiplication means that multiplies a beginning of the multi-bit signal by a fade factor to thereby perform fade-in processing at the beginning of the multi-bit signal and that multiplies an end of the multi-bit signal by the fade factor to thereby perform fade-out processing at the end of the multi-bit signal; and $\Delta\Sigma$ modulation means that re-converts the multi-bit signal from the multiplication means into a one-bit digital signal and that outputs the re-converted signal, wherein the control means iteratively outputs the one-bit digital signal of a predetermined period to the conversion means at a predetermined interval.

In the invention, a one-bit digital signal of a predetermined period with reference to a position designated by the jog dial is converted into a multi-bit signal, and fade-in processing and fade-out processing are performed. Accordingly, fade-in processing and fade-out processing can be readily performed, and noise, which would otherwise occur when the signal of a predetermined period is iteratively reproduced, is also lessened.

In one embodiment of the invention, the predetermined period is set to 70 msec, and the predetermined interval is set to 20 msec. When the signal of a predetermined period is iteratively reproduced and output at a predetermined interval, a ratio of the predetermined period to the predetermined interval greatly affects user's search operation. The user can easily identify a position in music by setting the predetermined period to 70 msec and the predetermined interval to 20 msec.

The invention enables a user to perform an easy, reliable search for a desired position even in a one-bit digital signal.

The invention will be more clearly comprehended by reference to the embodiments provided below. However, the embodiments provided below are illustrative, and the scope of the invention is not limited to the embodiments.

BRIEF DESCRIPTION OF THE DRAWINGS

Preferred embodiments of the present invention will be described in detail by reference to the following drawings, wherein.

DETAILED DESCRIPTION

Embodiments of the invention are hereunder described by reference to the drawings. The embodiments; however, are merely illustrative, and the invention is not limited to the embodiments.

Figure 1:
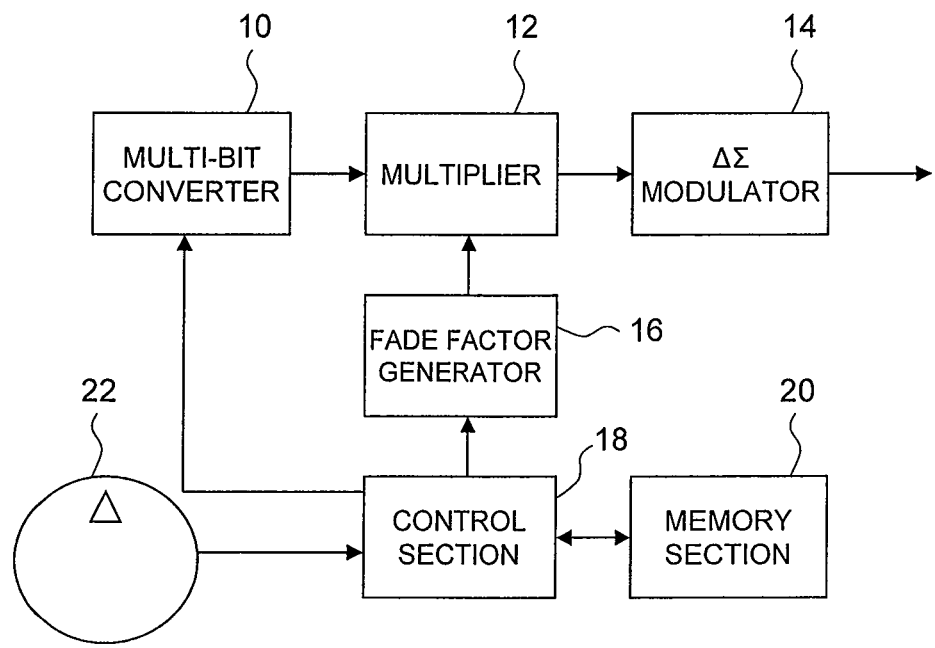
FIG. 1 is a block diagram of a digital signal processor of an embodiment.

FIG. 1 is a block diagram of a digital signal processor of an embodiment. To be specific, a digital signal processor of the embodiment is a two-channel digital audio recorder that records an input audio signal as a one-bit digital signal. However, the digital signal processor is not restricted to this, so long as the digital signal processor is not a multi-bit PCM recorder but a device that records a one-bit digital signal.

The digital signal processor is equipped with a multi-bit converter 10, a multiplier 12, a $\Delta\Sigma$ (delta-sigma) modulator 14, a fade factor generator 16, a control section 18, a memory section 20, and a jog (JOG) dial 22. In addition to them, the digital signal processor has a variety of operation keys, a display section, a digital amplifier, a driver, a speaker, an input terminal, and an output terminal.

One of characteristics of the embodiment lies in that the digital signal processor has the jog dial 22 and can search for a desired position in music by use of the jog dial 22 while recording and reproducing the one-bit digital signal.

The control section 18 is made up of a microprocessor and comprehensively controls the entirety of the digital signal processor. Commanded to call a search function by means of a command key, the control section 18 reads a DSD (Direct Streaming Digital) signal or a one-bit digital signal (a one-bit digital audio signal) stored in the memory section 20, supplying the thus-read signal to the multi-bit converter 10. The one-bit digital signal to be supplied to the multi-bit converter 10 is digital data of a predetermined period, including a position designated by the jog dial 22, among one-bit digital signals that make up specific music stored in the memory section 20.

The multi-bit converter 10 converts the input one-bit digital signal into; for instance, a 32-bit signal, outputting the thus-transformed multi-bit signal to the multiplier 12. The multi-bit converter 10 is made up of a known skipping filter or a decimation filter that converts a one-bit digital signal into a multi-bit signal. The decimation filter performs down-sampling operation for lowering a sampling frequency of an original signal by limiting its signal band.

The multiplier 12 multiplies a multi-bit digital signal output from the multi-bit converter 10 by a factor, thereby performing fade-in and fade-out processing. A factor to be used for multiplying the multi-bit digital signal by the multiplier 12 is supplied from the fade factor generator 16.

The fade factor generator 16 generates a factor in accordance with a control signal output from the control section 18, outputting the factor to the multiplier 12. Specifically, fade-in processing for gradually increasing a level of a digital signal is performed by generating a factor which gradually increases from zero. Fade-out processing for gradually decreasing the level of the digital signal is performed by generating a factor which gradually decreases to zero. The control section 18 sets a fade-in period and a fade-out period.

The $\Delta\Sigma$ (delta-sigma) modulator 14 is equipped with an adder, an integrator, a comparator, a delay, and a feedback circuit. $\Delta\Sigma$ modulation is known. A signal output from the adder is integrated by the integrator, and the comparator determines by means of comparison if the sign of the integrated value is positive or negative. When the sign is positive, "one" is output. When the sign is negative, "zero" (or "−1") is output. After output, the numeral is negatively fed back to the adder with a delay of one sample. Modulation processing mentioned above is performed in synchronism with sync clock.

The memory section 20 is made up of; for instance, semiconductor memory, and stores music data as a one-bit digital signal.

The jog (JOG) dial 22 is disposed at a predetermined position on the digital signal processor; for instance, a front panel, and can be rotatively actuated. The user can search for a desired position in music by rotatively actuating the jog dial 22. In this regard, the jog dial 22 can be provided on a remote controller to be connected to the digital signal processor by means of wired or wireless transmission. Needless to say, in this case, the remote controller is also taken as a part of the digital signal processor.

Search processing of the embodiment is hereunder described in more detail. Search will be performed on the premise that audio signals of one or a plurality of pieces of music data are already stored in the memory section 20 as a one-bit digital signal.

When the user rotatively actuates the jog dial 22 to search for a desired position in specific music, an operation signal is fed to the control section 18.

The control section 18 takes a position designated by rotative actuation of the jog dial 22 as a starting point, extracting music data of a predetermined time; for instance, 70 msec, from the memory section 20, and stores the thus-extracted music data into buffer memory. A one-bit digital signal of the music data of a predetermined period stored in the buffer memory is iteratively output to the multi-bit converter 10.

The multi-bit converter 10 made up of; for instance, a decimation filter converts a one-bit digital signal of iteratively input music data into a multi-bit signal; for instance, a 32-bit multi-bit signal, outputting the 32-bit multi-bit signal to the multiplier 12. In this connection, conversion of music data into a multi-bit signal can also be said to be conversion that is implemented by skipping, averaging, or a low pass filter.

The multiplier 12 subjects the multi-bit digital signal to fade-in processing in which a level of the signal is sequentially, gradually increased from zero by sequentially multiplying a beginning of music data by a factor, as well as subjecting the multi-bit digital signal to fade-out processing in which the level of the signal is sequentially, gradually decreased to zero by sequentially multiplying an end of the music data by a factor. Specifically, there is performed fade-in processing for multiplying the beginning of music by a factor sequence that gradually increases from zero. Further, there is performed fade-out processing for multiplying the end of music by a factor that gradually decreases to zero in order which is reversal of occurrence of the factor sequence. A period of fade-in and a period of fade-out are fixed, respectively. They are set to; for instance, 5 msec, respectively. A signal extracted by the control section 18 has a period of 70 msec. A first 5-msec period of 70 msec corresponds to a fade-in period, and a last 5-msec period of 70 msec corresponds to a fade-out period. Difficulty is encountered in performing fade-in processing or fade-out processing by directly multiplying the one-bit digital signal by a factor. However, a technique of performing fade-in processing or fade-out processing by multiplying a multi-bit digital signal; for instance, a 32-bit digital signal, by a factor has already been known.

The $\Delta\Sigma$ modulator 14 subjects the multi-bit digital signal, which has undergone fade-in and fade-out processing, to $\Delta\Sigma$ modulation, thereby again converting the digital signal into a one-bit digital signal and outputting a resultant digital signal. The one-bit digital signal is output from a speaker by way of an unillustrated digital amplifier and an unillustrated driver.

Figure 2:
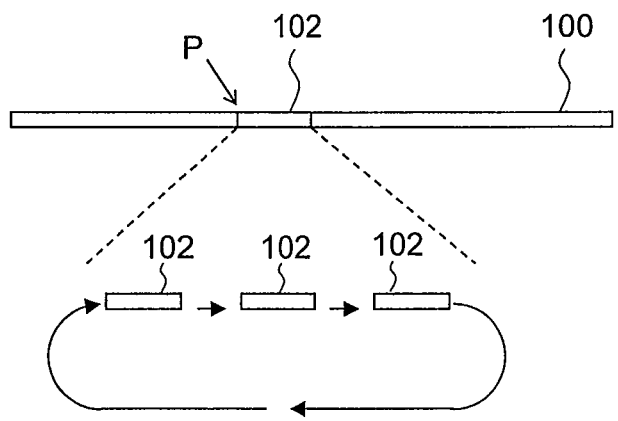
FIG. 2 is an explanatory view of iterative reproduction.

FIG. 2 shows iterative reproduction of a part of music data in the embodiment. A position in the music data 100 designated by the jog dial 11 is taken as a starting point P. Music data 102 that exist in a predetermined period of; for instance, 100 msec (which can be arbitrarily set), are extracted. The thus-extracted music data 102 are stored in the buffer memory of the control section 18. The music data are iteratively read and processed by the multi-bit converter 10, the multiplier 12, and the $\Delta\Sigma$ modulator 14, and subsequently output from the speaker. Accordingly, the same music data are iteratively reproduced and output from the speaker, whereupon iterative sound "Va-Va-Va" is output. By listening to this iterative sound, the user can recognize which part of the music data is now reproducing.

When the user rotatively actuates the jog dial 22, a position designated by the jog dial 22 moves, whereupon the starting point P also moves. Accordingly, the music data 102 also change. Likewise, the thus-changed music data are stored in the buffer memory of the control section 18. The music data are then iteratively read and subsequently processed by means of the multi-bit converter 10, the multiplier 12, and the $\Delta\Sigma$ modulator, and the thus-processed music data are output from the speaker. By listening to the iterative sound, the user can recognize which part of the music part is now reproducing.

By repeating operation for rotation the jog dial 22 and listening to iterative sound a required number of times, the user can readily, reliably search for a desired position in the music data by means of the jog dial 22.

Figure 3A:
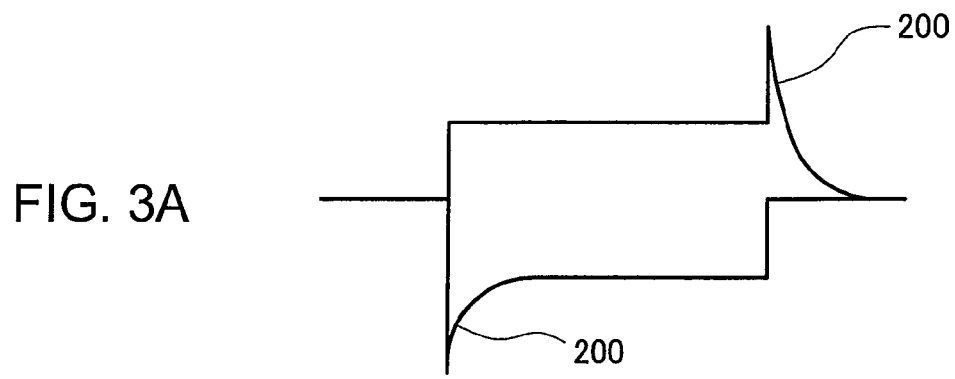
FIG. 3A is an explanatory chart of a signal waveform appearing before fading is performed in the embodiment.

If music data of a predetermined period are read at the starting point designated by the jog dial 22 from the memory section 20 and iteratively reproduced and output without modification, an abrupt change occurs in pulse density of the start and the end of the music data because of a characteristic of a one-bit digital signal that represents a signal level by means of pulse density using 0 and 1 as shown in FIG. 3A. Thus, spike noise 200 occurs. The user listens to the spike noise 200 as "Passu" sound and feels uneasy about such noise "Passu" that occurs between iterative sounds, thereby encountering difficulty in searching for a desired position.

Figure 3B:
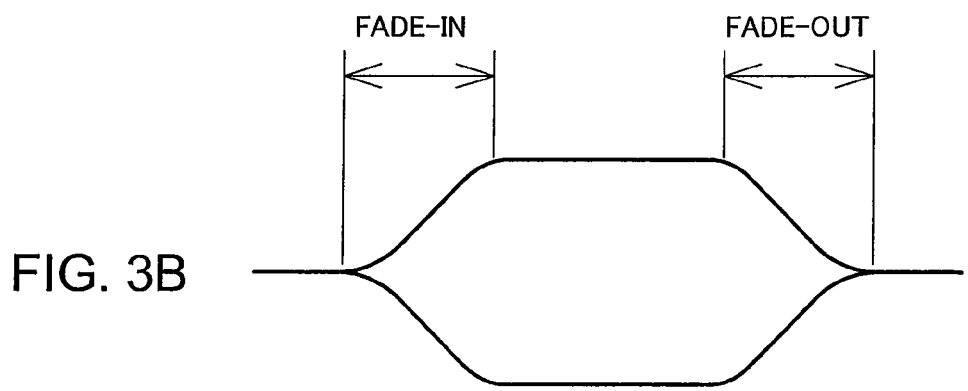
FIG. 3B is an explanatory chart of a signal waveform appearing after fading is performed in the embodiment.

On the contrary, as in the embodiment, fade-in processing is performed at the beginning of music data, and fade-out processing is performed at the end of the music data. As shown in FIG. 3B, occurrence of spike noise is inhibited. Thereby, noise does not occur between iterative sounds, and the user can search for a desired position while concentrating on only the iterative sounds.

In the embodiment, the music data 102 of a predetermined period are iteratively reproduced while the position specified by the jog dial 22 is taken as a starting point. In relation to a combination of a time during which the music data 102 are reproduced with a silent time, the reproduction time and the silent time are preferably set, respectively.

If the reproduction time is excessively short, the user hardly determines a kind of sound (identify sound of a musical instrument from voice sound) and tone intervals. For instance, vowel sounds become hard to hear, or recognized sound sounds like "pu-pu-pu."

On the other hand, if the reproduction time is excessively long, sound becomes clearer to catch. However, a time during which the brain needs to retain sound instantaneously also becomes longer. As a consequence, when actuating the jog dial 22, the user forgets the sound retained before actuation, which makes the user hard to recognize a position. The same also occurs even when the silent time is excessively long, so that the user forgets the retained sound. Thus, the sound is heard as it were sound skip.

Having diligently conducted tests and consideration in the light of the facts, the applicant found an optimum combination of a reproduction time of 70 msec with a silent time of 20 msec.

Figure 4:
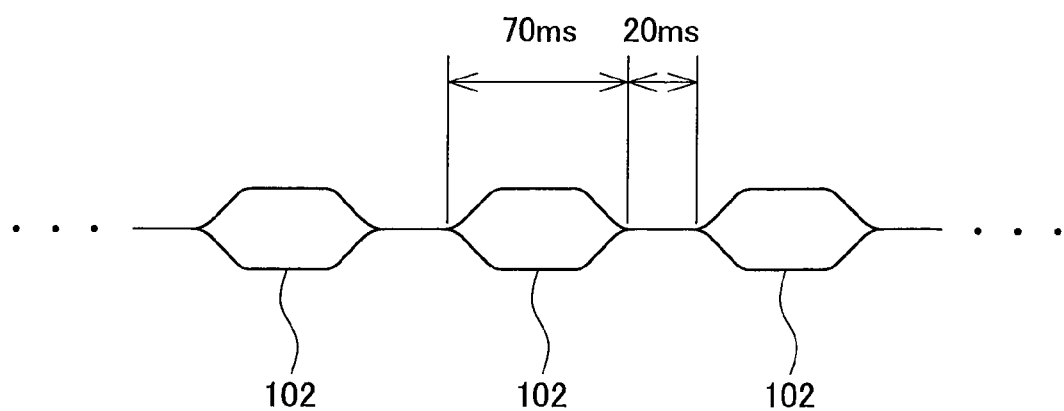
FIG. 4 is an explanatory chart showing a ratio of a reproduction time to a silent time in the embodiment.

FIG. 4 shows a timing chart of iterative reproduction performed in the embodiment. The music data 102 are repeatedly reproduced while 70 msec and 20 msec are taken as a reproduction time and a silent time, respectively. A fade-in period of 5 msec is set at the beginning of the music data 102, and a fade-out period of 5 msec is set at the end of the music data 102. In the embodiment, in view of the findings that an optimum ratio of the reproduction time to the silent time is a 70 msec:20 msec ratio, the ratio of 70 msec to 20 msec is maintained as it is even after the music data are subjected to fade-in processing and fade-out processing. Moreover, even when the position of the music data is moved by rotation of the jog dial 22 performed by the user, the ratio of 70 msec to 20 msec is maintained as it is. In this regard; however, how reproduced sound is heard during actuation of the jog dial 22 varies from one person to another. For this reason, it should be previously noted that the ratio of 70 msec to 20 msec is statistically optimum but not absolute. In other words, a margin of plus or minus several milliseconds is allowable as changes in ratio.

As above, in the embodiment, even in the case of a one-bit digital signal, a search for a desired position in music can be readily performed without fail by use of the jog dial 22. In addition, in order to enable performance of an elaborate search, it is necessary to set a narrow step width at which a shift is carried out by rotative actuation of the jog dial 22. However, the control section 18 can also read in advance a one-bit digital signal stored in the memory section 20 to a certain extent, store the thus-read signal in the buffer memory, and read data to be output to the multi-bit converter 10 from the buffer memory in each case.

In the embodiment, the multi-bit converter 10 transforms the one-bit digital signal into a multi-bit signal, and the multiplier 12 subjects the multi-bit signal to fade-in processing and fade-out processing. Subsequently, the $\Delta\Sigma$ modulator 14 subjects the thus-processed signal to $\Delta\Sigma$ modulation, thereby re-converting the signal into a one-bit digital signal and outputting the one-bit digital signal. An order of the $\Delta\Sigma$ modulator 14 is arbitrary, and a signal-to-noise ration and sound quality are enhanced by increasing the order.

Figure 5:
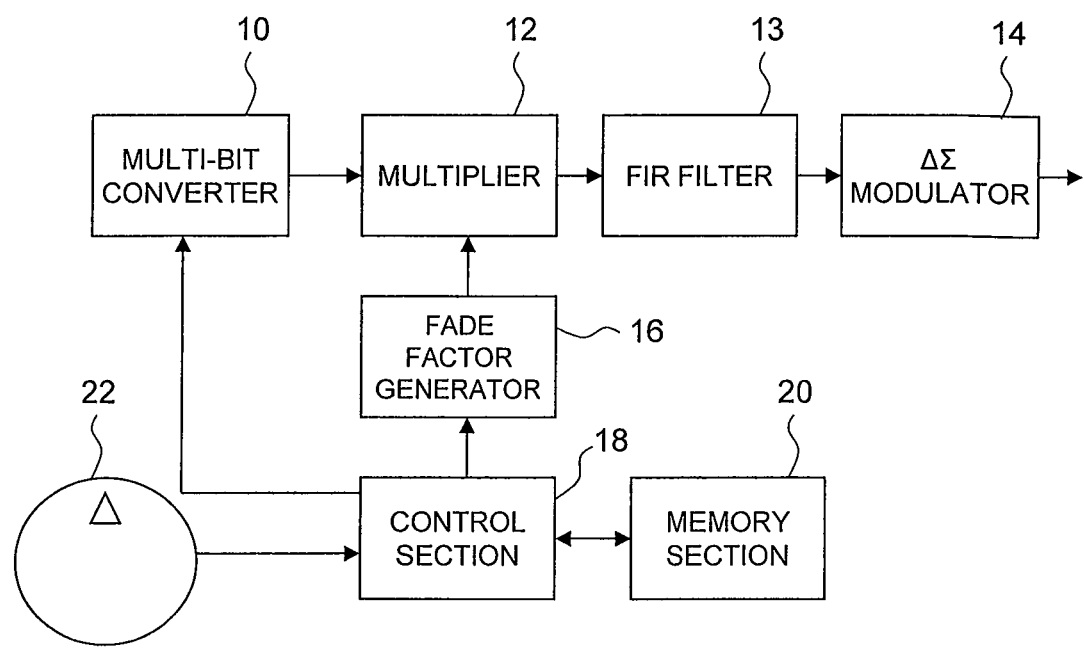
FIG. 5 is a block diagram of another embodiment.

Moreover, if a modulator with a third order or higher is used in the embodiment, the $\Delta\Sigma$ modulator 14 might also cause oscillation. In this case; however, an FIR filter 13 that dampens oscillation can also be interposed, as shown in FIG. 5, between the multiplier 12 and the $\Delta\Sigma$ modulator 14.

Further, in the embodiment, the control section 18 extracts a signal of a predetermined period in the one-bit digital signal stored in the memory section 20 during a search and repeatedly outputs the thus-extracted signal to the multi-bit converter 10. However, needless to say, a one-bit digital signal read from the memory section 20 is output from the speaker, during normal reproduction, without modification by way of a digital amplifier and a driver.

In the embodiment, the control section 18 takes a position designated by rotative actuation of the jog dial 22 as a starting point and extracts a signal of a predetermined period from the starting point. On the contrary, a position designated by rotative actuation of the jog dial 22 can also be taken as an end point, and a preceding signal of a predetermined period can be extracted. Alternatively, a preceding signal of a predetermined period and a subsequent signal of a predetermined period can also be extracted with reference to a position designated by rotative actuation of the jog dial 22. In short, the essential requirement is to extract from the memory section 20 a signal of a predetermined period with reference to the position designated by rotative actuation of the jog dial 22 and iteratively output the thus-extracted signal.

Further, in the embodiment, the jog dial 22 is exemplified by a dial that the user can physically grip and actuate. However, the jog dial 22 can also be exemplified by software as a dial which the user can rotatively actuate by touching a panel. Namely, the jog dial of the invention is not limited to hardware and can also be implemented by software.

What is claimed is:

1. A digital signal processor with a search function comprising:

memory means that stores a one-bit digital signal;

a jog dial that can be rotatively actuated by a user;

control means that extracts from the memory means the one-bit digital signal of a predetermined period with reference to a position designated by rotative actuation of the jog dial;

conversion means for converting the extracted one-bit digital signal into a multi-bit signal;

multiplication means that multiplies a beginning of the multi-bit signal by a fade factor to thus perform fade-in processing at the beginning of the multi-bit signal and that multiplies an end of the multi-bit signal by the fade factor to thus perform fade-out processing at the end of the multi-bit signal; and ΔΣ modulation means that re-converts the multi-bit signal from the multiplication means into a one-bit digital signal and that outputs the re-converted signal, wherein the control means iteratively outputs the one-bit digital signal of a predetermined period to the conversion means at a predetermined interval.

2. The digital signal processor according to claim 1, wherein the predetermined period is 70 msec, and the predetermined interval is 20 msec.

3. The digital signal processor according to claim 1, further comprising:

an FIR filter interposed between the multiplication means and the ΔΣ modulation means.

4. The digital signal processor according to claim 1, wherein the control means takes a position designated by rotative actuation of the jog dial as a starting point and extracts from the memory means the one-bit digital signal of a predetermined period with reference to the starting point.

5. The digital signal processor according to claim 1, wherein the control means takes a position designated by rotative actuation of the jog dial as an end point and extracts from the memory means the one-bit digital signal of a predetermined period with reference to the end point.

6. The digital signal processor according to claim 1, wherein the control means extracts from the memory means a preceding one-bit digital signal and a subsequent one-bit digital signal with reference to a position designated by rotative actuation of the jog dial.

7. The digital signal processor according to claim 1, wherein the jog dial is a dial that can be gripped and rotatively actuated by the user.

8. The digital signal processor according to claim 1, wherein the jog dial is a dial that is displayed on a touch panel and that the user can touch.

* * * * *